(12) United States Patent
Vila Casado et al.

(10) Patent No.: US 7,802,172 B2
(45) Date of Patent: Sep. 21, 2010

(54) VARIABLE-RATE LOW-DENSITY PARITY CHECK CODES WITH CONSTANT BLOCKLENGTH

(75) Inventors: Andres I. Vila Casado, Los Angeles, CA (US); Wen-Yen Weng, Los Angeles, CA (US); Richard D. Wesel, Manhattan Beach, CA (US); Nicola Moschini, Lodi (IT); Massimiliano Siti, Milan (IT); Stefano Valle, Milan (IT); Engling Yeo, Milpitas, CA (US)

(73) Assignees: STMicroelectronics, Inc., Carrollton, TX (US); STMicroelectronics S.r.l., Agrate (Brianza) (IT); The Regents of the University of California, Oakland, CA (US)

( * ) Notice: Subject to any disclaimer, the term of this patent is extended or adjusted under 35 U.S.C. 154(b) by 1128 days.

(21) Appl. No.: 11/471,439

(22) Filed: Jun. 20, 2006

(65) Prior Publication Data

US 2007/0011569 A1   Jan. 11, 2007

Related U.S. Application Data

(60) Provisional application No. 60/692,120, filed on Jun. 20, 2005.

(51) Int. Cl.
G06F 11/00 (2006.01)
H03M 13/00 (2006.01)

(52) U.S. Cl. .................................................. 714/801

(58) Field of Classification Search ......... 714/800–801, 714/807
See application file for complete search history.

(56) References Cited

U.S. PATENT DOCUMENTS 7,458,009 B2 * 11/2008 Yu et al. .................... 714/800
7,502,987 B2 * 3/2009 Kyung et al. ............... 714/781

OTHER PUBLICATIONS

R. G. Gallager, "Low-Density Parity-Check Codes," IRE Trans Inform. Theory, vol. IT-8, pp. 21-28, Jan. 1962.

J. Hagenauer, "Rate-Compatible Punctured Convolutional Codes and Their Applications," IEEE Transactions on Communications, vol. 36, pp. 389-400, Apr. 1988.

J. Ha and S.W. McLaughlin, "Analysis and design of punctured LDPCCs over Gaussian channel with erasures," Proc. Int. Symposium Inform. Theory, Lausanne, Switzerland, Jun. 2002.

T. Tian, C. Jones, and J. Villasenor. "Rate compatible low-density parity-check codes," in ISIT 2004, Chicago, Jul. 2004.

M. Yang, W. E. Ryan, and Y. Li, Design of Efficiently Encodable Moderate-Length High-Rate Irregular LDPC Codes, IEEE Transactions on Communications, vol. 52, No. 4, pp. 564-571, Apr. 2004.

(Continued)

*Primary Examiner*—Shelly A Chase
(74) *Attorney, Agent, or Firm*—Lisa K. Jorgenson; William A. Munck

(57) ABSTRACT

Low density parity check (LDPC) codes (LDPCCs) have an identical code blocklength and different code rates. At least one of the rows of a higher-rate LDPC matrix is obtained by combining a plurality of rows of a lower-rate LDPC matrix with the identical code blocklength as the higher-rate LDPC matrix.

36 Claims, 10 Drawing Sheets

OTHER PUBLICATIONS

M. P. C. Fossorier, Iterative Reliability-Based Decoding of Low-Density Parity Check Codes, IEEE Journal on Selected Areas in Communications, vol. 19, No. 5, pp. 908-917, May 2001.

T.J. Richardson and R. Urbanke, "Efficient encoding of low-density parity-check codes," IEEE Transactions on Information Theory, vol. 47 No. 2, Feb. 2001.

M. M. Mansour and N. R. Shanbhag, "Low power VLSI decoder architectures for LDPCCs," in 2002 International Low Power Electronics and Design, 2002, pp. 284-289.

Tian T., Jones C., Villasenor J. D. and Wesel R. D., "Selective Avoidance of Cycles in Irregular LDPCC Construction," IEEE Transactions on Communications, Aug. 2004.

Y. Mao and A. H. Banihashemi, "A heuristic search for good low-density parity-check codes at short block lengths," in Proc. IEEE Int. Conf. Communications, vol. 1, Helsinki, Finland, Jun. 2001, pp. 41-44.

D. M. Arnald, E. Eleftheriou, and X. Y. Hu, "Progressive edge-growth Tanner graphs," in Proc. IEEE Global Telecommunications Conf., vol. 2, San Antonio, TX, Nov. 2001, pp. 995-1001.

Ha et al., "Analysis and Design of LDPCCs over Gaussian Channels with Erasures", Proc Int. Symposium Inform. Theory, Lausanne, Switzerland, Jun. 2002.

Ha et al., "Optimal Puncturing of Irregular Low-Density Parity-Check Codes", 0-7803-7802-4/03 IEEE.

Mansour, et al., "High-Throughput LDPC Decoders", 1063-8210/03 IEEE.

William E. Ryan, "An Introduction to LDPC Codes", Aug. 19, 2003.

Ha et al., "Optimal Puncturing Distributions for Rate-Compatible Low-Density Parity-Check Codes", 0-7803-7728-1/03 IEEE.

Yang et al., "Lowering the Error-Rate Floors of Moderate-Length High-Rate Irregular LDPC Codes", ISIT 2003, Yokohama, Japan, Jun. 29-Jul. 4, 2003.

Ramamoorthy et al., "Construction of Short Block Length Irregular Low-Density Parity-Check Codes", in Proc. IEEE ICC 2004, Paris, France, Jun. 2004.

\* cited by examiner

FIG. 4

VARIABLE-RATE LOW-DENSITY PARITY CHECK CODES WITH CONSTANT BLOCKLENGTH

CROSS-REFERENCE TO RELATED APPLICATION

This application claims priority under 35 U.S.C. §119(e) to co-pending U.S. Provisional Application Ser. No. 60/692,120, entitled "VARIABLE-RATE LOW-DENSITY PARITY CHECK CODES WITH CONSTANT BLOCKLENGTH," filed on Jun. 20, 2005, by Andres I. Vila Casado, Wen-Yen Weng, Richard D. Wesel, Nicola Moschini, Massimiliano Siti, Stefano Valle and Engling Yeo, which application is incorporated by reference herein.

BACKGROUND OF THE INVENTION

1. Field of the Invention

The invention generally relates to the area of data communication and data storage and relates more particularly to low-density parity-check (LDPC) codes (LDPCCs) that support a plurality of rates while maintaining a constant block length.

2. Description of the Related Art (Note: This application references a number of different publications as indicated throughout the specification by one or more reference numbers within brackets, e.g., [x]. A list of these different publications ordered according to these reference numbers can be found below in the section entitled "References." Each of these publications is incorporated by reference herein.)

LDPCCs are error-correcting codes used in data communications systems, as well as other systems like data storage devices. They were first introduced by Gallager in [1].

Practical data communication systems often need to operate at several different transmission rates. To keep the implementation as simple as possible, the same basic hardware architecture should be able to decode the encoded data at all the possible rates. One way to achieve this is to generate higher-rate codes by puncturing lower-rate codes. This technique was applied to convolutional codes in [2] and later applied to LDPC codes in [3] and [4]. However, puncturing reduces the code blocklength, which degrades performance. For the highest-rate codes where the puncturing is most severe, the performance degradation is significant when compared to an LDPCC with the original blocklength.

Another way to achieve this is to generate lower-rate codes by shortening higher-rate codes, as described in [4]. As with puncturing, shortening reduces the code blocklength, which degrades performance. For the lowest-rate codes where the shortening is most severe, the performance degradation is significant when compared to an LDPCC with the original blocklength.

The present invention describes a different approach that maintains the same blocklength across a plurality of rates.

SUMMARY OF THE INVENTION

The present invention discloses LDPCCs that share the same fundamental structure while having an identical code blocklength and different code rates. At least one row of a higher-rate LDPC matrix is obtained by combining a plurality of rows of a lower-rate LDPC matrix with the identical code blocklength as the higher-rate LDPC matrix.

BRIEF DESCRIPTION OF THE DRAWINGS

Referring now to the drawings in which like reference numbers represent corresponding parts throughout:

FIG. 4 provides examples (for a 10×10 sub-matrix) that illustrate the structure of sub-matrices of the "mother" LDPC matrix;

DETAILED DESCRIPTION OF THE INVENTION

In the following description of a preferred embodiment, reference is made to the accompanying drawings, which form a part hereof, and in which is shown by way of illustration a specific embodiment in which the invention may be practiced. It is to be understood that other embodiments may be utilized and structural changes may be made without departing from the scope of the present invention.

Overview

The present invention describes a new method for designing LDPCCs for a variety of different rates that all share the same fundamental encoder/decoder architecture. In the present invention, combining rows of a parity-check matrix for a lower-rate code (a "mother" code) produces one or more parity-check matrices for one or more higher-rate codes (the "effective" codes). An important advantage of this approach is that a plurality of codes with different rates have the same blocklength (a key performance factor). Also, a plurality of codes with different rates have the same variable degree distribution.

LDPCC Architecture

Figure 1A:
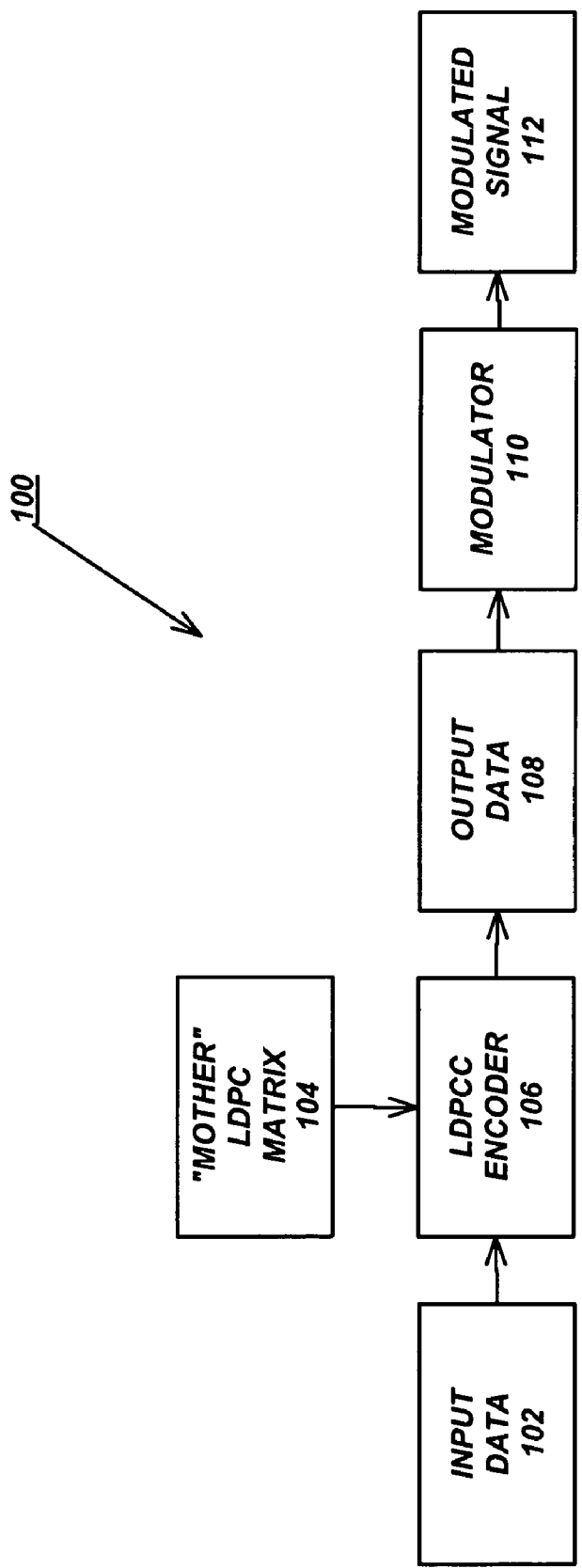
FIG. 1A illustrates an exemplary transmitter according to an embodiment of the present invention.

FIG. 1A illustrates an exemplary transmitter 100 that generally includes, inter alia, input data 102, "mother" LDPC matrix 104, LDPCC encoder 106, output data 108, modulator 110 and the modulated signal 112.

The input data 102, u, is a binary vector having a length $k_e \geq k_0$. The length $k_0$ is a specified minimum length of the input data 102 for the "mother" LDPC matrix 104. The length $k_e$ varies as different effective codes are employed.

The output data 108, c, is a binary vector having a length n where n is a constant.

The "mother" LDPC matrix 104 is a parity-check matrix $H_0$ of size $(n-k_0) \times n$.

The LDPC encoder 106 produces the output data 108, which is a vector that comprises the results of the $k_e$-element vector of the input data 102 being multiplied on the right by a $k_e \times n$ effective generator matrix $G_e$ (i.e. $c = u\, G_e$). The effective generator matrix $G_e$ is related to an effective LDPC matrix $H_e$ by the matrix equation $G_e H_e^T = 0$, wherein T indicates the matrix transpose operation and 0 is the $k_e \times (n-k_e)$ matrix of zeros. The effective LDPC matrix $H_e$ of size $(n-k_e) \times n$ is related to the "mother" LDPC matrix 104 through row combining.

The actual vector-matrix multiplication for encoding may be replaced by a lower-complexity operation that produces the same result, as described, for example, in [5] and [7], if the "mother" LDPC matrix 104 is constrained to have a certain structure. Indeed, preferred embodiments may specifically seek to so constrain the "mother" LDPC matrix 104, so that $H_0$ and all matrices $H_e$ of interest have a structure that permits lower-complexity encoding, hence avoiding the explicit matrix multiplication by the effective generator matrix $G_e$.

The modulator 110 transforms the output data 108 into a modulated signal 112 that can be transmitted over a channel.

Figure 1B:
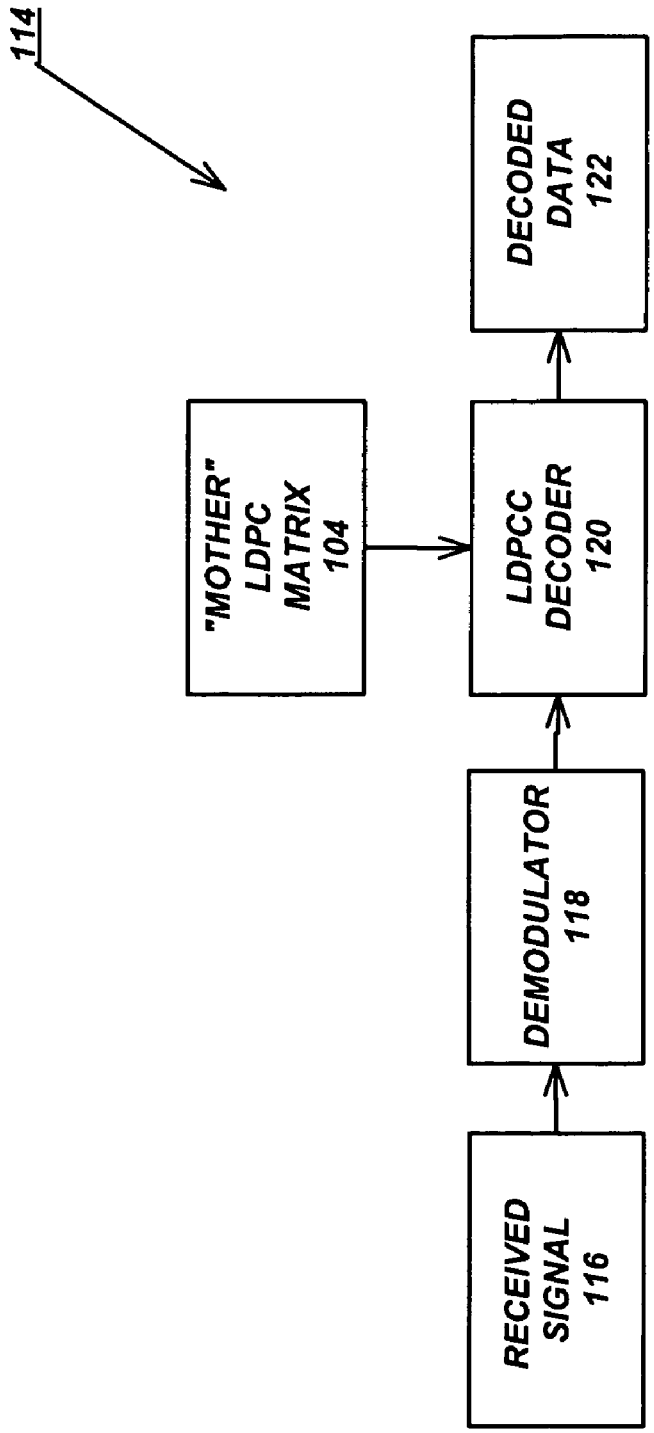
FIG. 1B illustrates an exemplary receiver according to an embodiment of the present invention.

FIG. 1B illustrates an exemplary receiver 114 that generally includes, inter alia, the received signal 116 as input, demodulator 118, "mother" LDPC matrix 104, LDPCC decoder 120, and decoded data 122 as output.

The demodulator 118 transforms the received signal 116 into reliability information about the output data 108.

This reliability information is then processed by the LDPCC decoder 120, using the "mother" LDPC matrix 104, to produce the decoded data 122, using some form of iterative message-passing (for example, as described in [6]).

The decoded data 122 is an estimate of the input data 102.

Those skilled in the art will recognize that the exemplary transmitter 100 and receiver 114 illustrated in FIGS. 1A and 1B are not intended to limit the present invention. Indeed, those skilled in the art will recognize that any combination of the above components, or any number of different components, hardware, and/or software, may be used to implement the present invention.

The "Mother" LDPC Matrix and the Effective LDPC Matrices

The basic idea of the present invention is to generate higher-rate "effective" LDPC matrices from a low-rate "mother" LDPC matrix 104 by reducing the number of rows in the "mother" LDPC matrix 104. Consider an example "mother" LDPC matrix 104 shown below:

$$H_0 = \begin{bmatrix} 1 & 1 & 1 & 0 & 0 & 0 & 0 & 0 & 0 & 0 & 0 & 0 \\ 1 & 0 & 0 & 1 & 1 & 0 & 0 & 0 & 0 & 0 & 0 & 0 \\ 0 & 0 & 0 & 0 & 1 & 1 & 1 & 0 & 0 & 0 & 0 & 0 \\ 0 & 0 & 0 & 0 & 0 & 0 & 1 & 1 & 1 & 0 & 0 & 0 \\ 0 & 0 & 0 & 0 & 0 & 0 & 0 & 0 & 1 & 1 & 1 & 0 \\ 0 & 0 & 1 & 0 & 0 & 0 & 0 & 0 & 0 & 0 & 1 & 1 \end{bmatrix} \quad (1.1)$$

This LDPC matrix 104 has dimensions $(n-k_0) \times n = 6 \times 12$. Thus, $k_0=6$ and $n=12$. As a result, the rate of the LDPCC described by this LDPC matrix 104 is $k_0/n=1/2$.

Figure 2A:
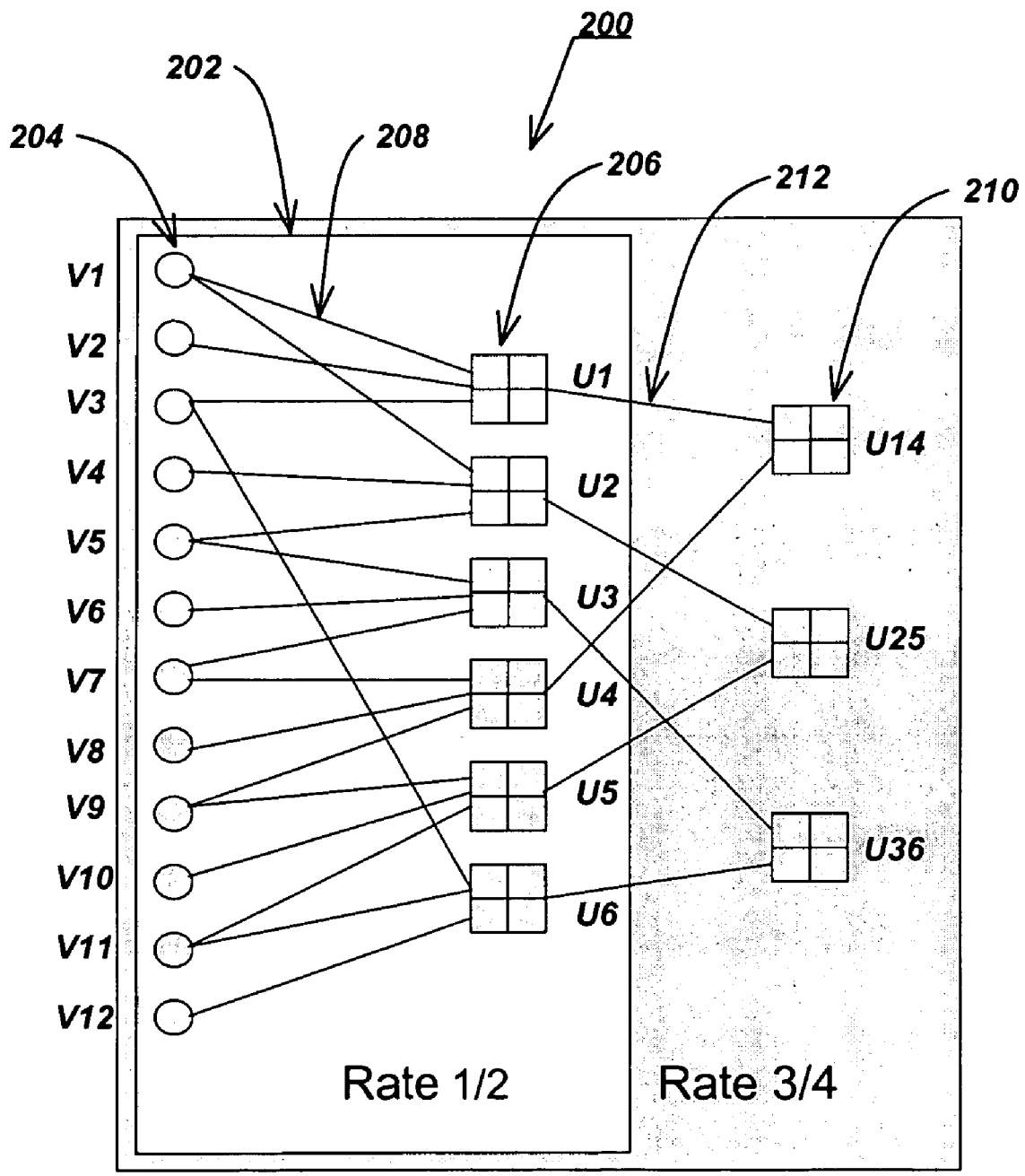
FIGS. 2A, 2B, 2C and 2D illustrate bi-partite graph representations for higher-rate "effective" LDPC matrices and for an example "mother" LDPC matrix.

FIGS. 2A, 2B, 2C and 2D illustrate bi-partite graph representations for higher-rate "effective" LDPC matrices, labeled as 200, and for the example "mother" LDPC matrix 104, labeled as 202. In the bipartite graph 202, columns in the "mother" LDPC matrix 104 correspond to variable nodes 204 labeled V1-V12, and rows in the "mother" LDPC matrix 104 correspond to check nodes 206 labeled U1-U6. Each element (j,i) of the "mother" LDPC matrix 104 is a "1" if Vi has an edge 208 connecting it to Uj, and a "0" otherwise. The resulting bi-partite graph 202 completely describes the "mother" LDPC matrix 104 and vice versa. The specific example given in 202 of FIG. 2A is the bi-partite graph corresponding to the "mother" LDPC matrix given in equation (1.1).

Although the LDPC matrix 104 of equation (1.1) and the corresponding graphs 202 shown in FIGS. 2A, 2B, 2C and 2D are 6×12, those skilled in the art will recognize that, in general, the graph 202 may have any number (e.g., tens, hundreds, thousands or more) of variable and check nodes 204, 206, and FIGS. 2A, 2B, 2C and 2D are provided only for the purposes of illustration.

To produce a higher-rate "effective" LDPC matrix, certain groups of rows from the "mother" LDPC matrix 104 are combined to produce a single row in the "effective" LDPC matrix. For example, combining groups of two rows, specifically rows 1 and 4, rows 2 and 5, and rows 3 and 6 of equation (1.1), produces the following "effective" LDPC matrix:

$$H_e = \begin{bmatrix} 1 & 1 & 1 & 0 & 0 & 0 & 1 & 1 & 1 & 0 & 0 & 0 \\ 1 & 0 & 0 & 1 & 1 & 0 & 0 & 0 & 1 & 1 & 1 & 0 \\ 0 & 0 & 1 & 0 & 1 & 1 & 1 & 0 & 0 & 0 & 1 & 1 \end{bmatrix} \quad (1.2)$$

This LDPC matrix has dimensions $(n-k_e) \times n = 3 \times 12$. Thus, $k_e=9$ and $n=12$. As a result, the rate of the LDPCC described by this LDPC matrix is $k_e/n=3/4$. Thus, two LDPC matrices with different rates of 1/2 and 3/4 both share the same "mother" LDPC matrix 104.

Reducing the number of rows by linearly combining rows is equivalent to replacing a group of check nodes 206 with a single check node that sums all the edges 208 coming into each of the original check nodes 206.

FIG. 2A shows the resulting bi-partite graph 200 that results when pairs of rows are combined as above. The variable nodes 204 of the "mother" LDPC matrix 104 are also the variable nodes 204 of the effective LDPC matrix. However, the check nodes 206 of the "mother" LDPC matrix 104 are now replaced by the check nodes 210 labeled U14, U25, and U36 for the "effective" LDPC matrix, wherein the check nodes 206 are connected to the check nodes 210 by edges 212. In preferred embodiments, no variable node 204 connects to two check nodes 206 in the "mother" LDPC matrix 104 that will be combined into a single check node 210 of an effective LDPC matrix. Thus, the check nodes 210 of the "effective" LDPC matrix connect to each variable node 204 at most once.

As another example of a higher-rate "effective" LDPC matrix, groups of at least three rows from the lower-rate "mother" LDPC matrix 104 are combined to produce a single row in the higher-rate "effective" LDPC matrix. Combining rows 1, 3 and 5 and combining rows 2, 4 and 6 of equation (1.1), produces the following "effective" LDPC matrix:

$$H_e = \begin{bmatrix} 1 & 1 & 1 & 0 & 1 & 1 & 1 & 0 & 1 & 1 & 1 & 0 \\ 1 & 0 & 1 & 1 & 1 & 0 & 1 & 1 & 1 & 0 & 1 & 1 \end{bmatrix} \quad (1.3)$$

This LDPC matrix has dimensions $(n-k_e) \times n = 2 \times 12$. Thus, $k_e=10$ and $n=12$. As a result, the rate of the LDPCC described by this LDPC matrix is $k_e/n=5/6$.

Figure 2B:
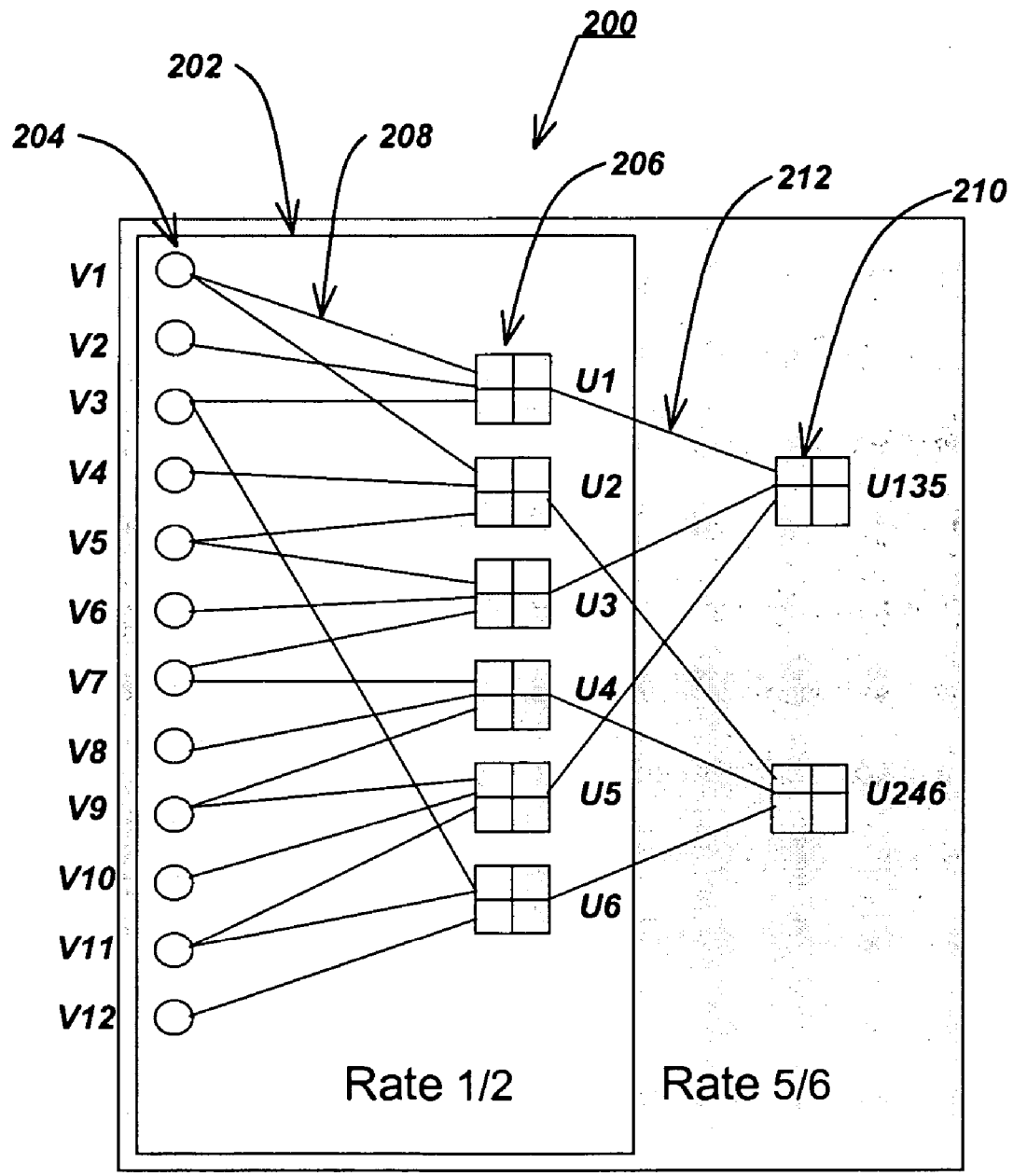

FIG. 2B shows a bi-partite graph 200 of this "effective" LDPC matrix. Columns in the "effective" LDPC matrix (1.3) correspond to variable nodes 204 labeled V1-V12. These are the same variable nodes 204 as for the "mother" LDPC matrix 104. Rows in the "effective" LDPCC matrix (1.3) correspond to the two check nodes 210 labeled U135 and U246. Each element of the "effective" LDPCC matrix (1.3) is a "1" if Vi has an edge connecting it the U corresponding to that row, and a "0" otherwise. The resulting bi-partite graph 200 of FIG. 2B completely describes the "effective" LDPC matrix (1.3) and vice versa.

Groups of various numbers of rows from the "mother" LDPC matrix 104 can be combined to produce rows in a higher-rate "effective" LDPC matrix. This is known as "Strict Row Combining." Combining rows 1 and 4, combining rows 2 and 5, and maintaining the original row 3 and row 6 of equation (1.1), produces the following "effective" LDPC matrix:

$$H_e = \begin{bmatrix} 0 & 0 & 0 & 0 & 1 & 1 & 1 & 1 & 0 & 0 & 0 & 0 \\ 1 & 1 & 1 & 0 & 0 & 0 & 1 & 1 & 1 & 0 & 0 & 0 \\ 1 & 0 & 0 & 1 & 1 & 0 & 0 & 0 & 1 & 1 & 1 & 0 \\ 0 & 0 & 1 & 0 & 0 & 0 & 0 & 0 & 0 & 0 & 1 & 1 \end{bmatrix} \quad (1.4)$$

This LDPC matrix has dimensions $(n-k_e) \times n = 4 \times 12$. Thus, $k_e = 8$ and $n = 12$. As a result, the rate of the LDPCC described by this LDPC matrix is $k_e/n = 2/3$.

Figure 2C:
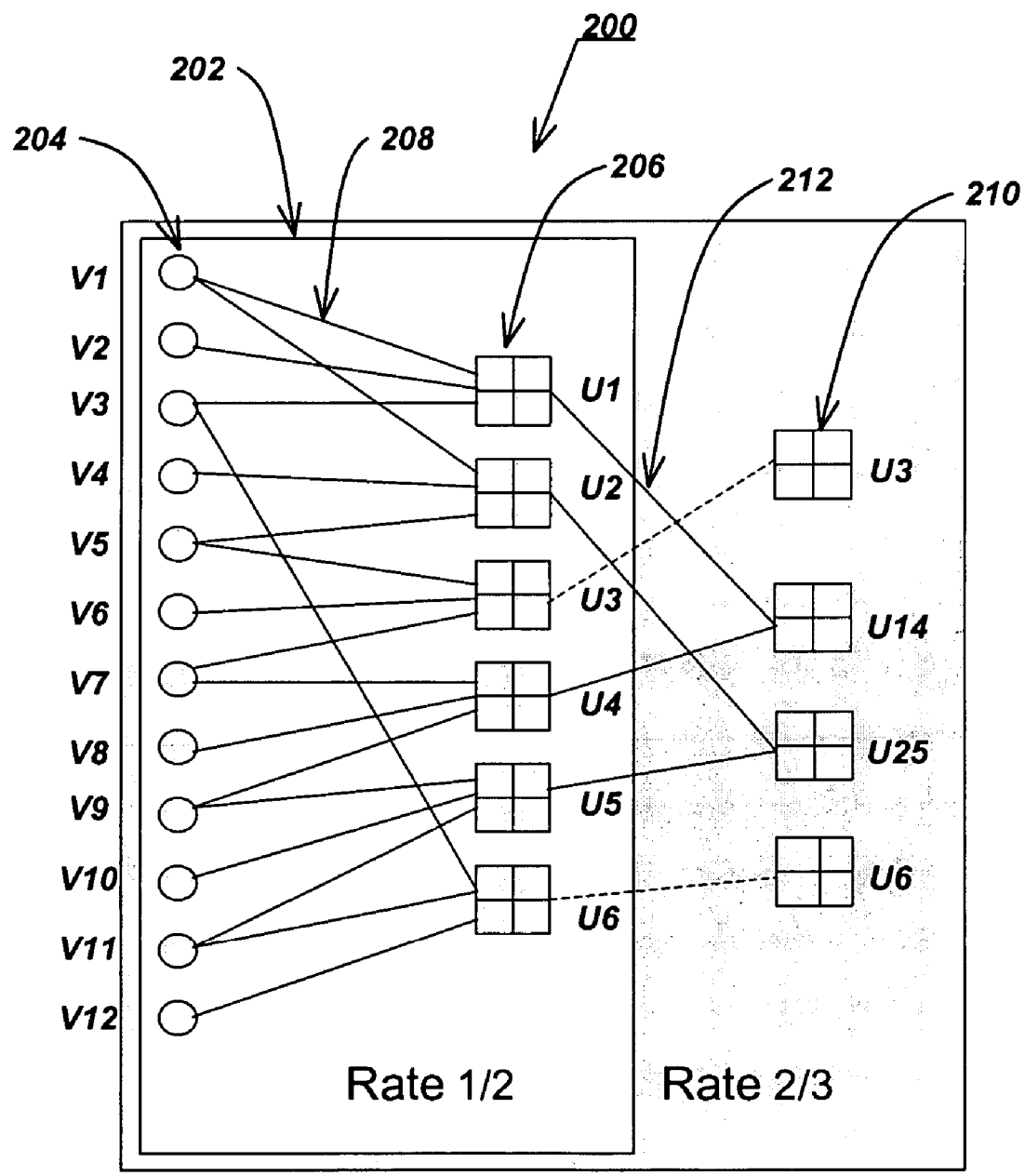

FIG. 2C shows a bi-partite graph 200 of this "effective" LDPC matrix. Columns in the "effective" LDPC matrix (1.4) correspond to variable nodes 204 labeled V1-V12. These are the same variable nodes 204 as for the "mother" LDPC matrix 104. Rows in the "effective" LDPCC matrix (1.4) correspond to check nodes 210 labeled U3, U14, U25, and U6. Each element of the "effective" LDPCC matrix (1.4) is a "1" if Vi has an edge connecting with the U corresponding to that row, and a "0" otherwise. The resulting bi-partite graph 200 of FIG. 2C completely describes the "effective" LDPC matrix (1.4) and vice versa.

Degree Distributions

The number of edges attached to a variable node 204 or check node 206, 210 is referred to as the degree of the variable node 204 or the degree of the check node 206, 210, respectively. The degree distribution describes the fraction of nodes that have each possible degree. The degree of a variable node 204 is also the number of 1's in the corresponding column. For example, the degree of variable node V1 for the "mother" LDPC matrix 104 is 2, because the number of 1's in the first column of equation (1.1) is 2. In preferred embodiments, where only rows that do not have a 1 in the same column are combined, the "effective" LDPC matrices all have the same variable node 204 degree distribution as the "mother" LDPC matrix 104. Although, in principle, different rates may require different variable node 204 degree distributions for theoretical optimality [7], a single variable node 204 degree distribution can be employed that works well for all the different code rates of interest.

A concentrated degree distribution is a degree distribution in which every node has the same degree. In principle, concentrated (or almost concentrated) check node 206, 210 degree distributions are desirable for theoretical optimality, as described in [7]. If the check node 206 degree distribution of the "mother" LDPC matrix 104 is concentrated, then the check node 210 degree distribution for the higher-rate "effective" code will also be concentrated if all the rows in the "effective" LDPC matrix result from combining the same number of rows of the "mother" LDPC matrix 104. In the examples above, the "effective" codes of rate 3/4 and rate 5/6 have a concentrated degree distribution. This is a preferred embodiment.

However, for many rates, it may not be possible to maintain a concentrated check node 206, 210 degree distribution. For example, the rate-2/3 code does not maintain a concentrated check node 210 degree distribution, and this may affect the performance of the code for longer blocklengths. A combination of shortening and row combining provides a solution for blocklengths where a large deviation from a concentrated degree distribution becomes problematic, as well as a way to obtain rates that are not possible with row-combining.

Figure 2D:
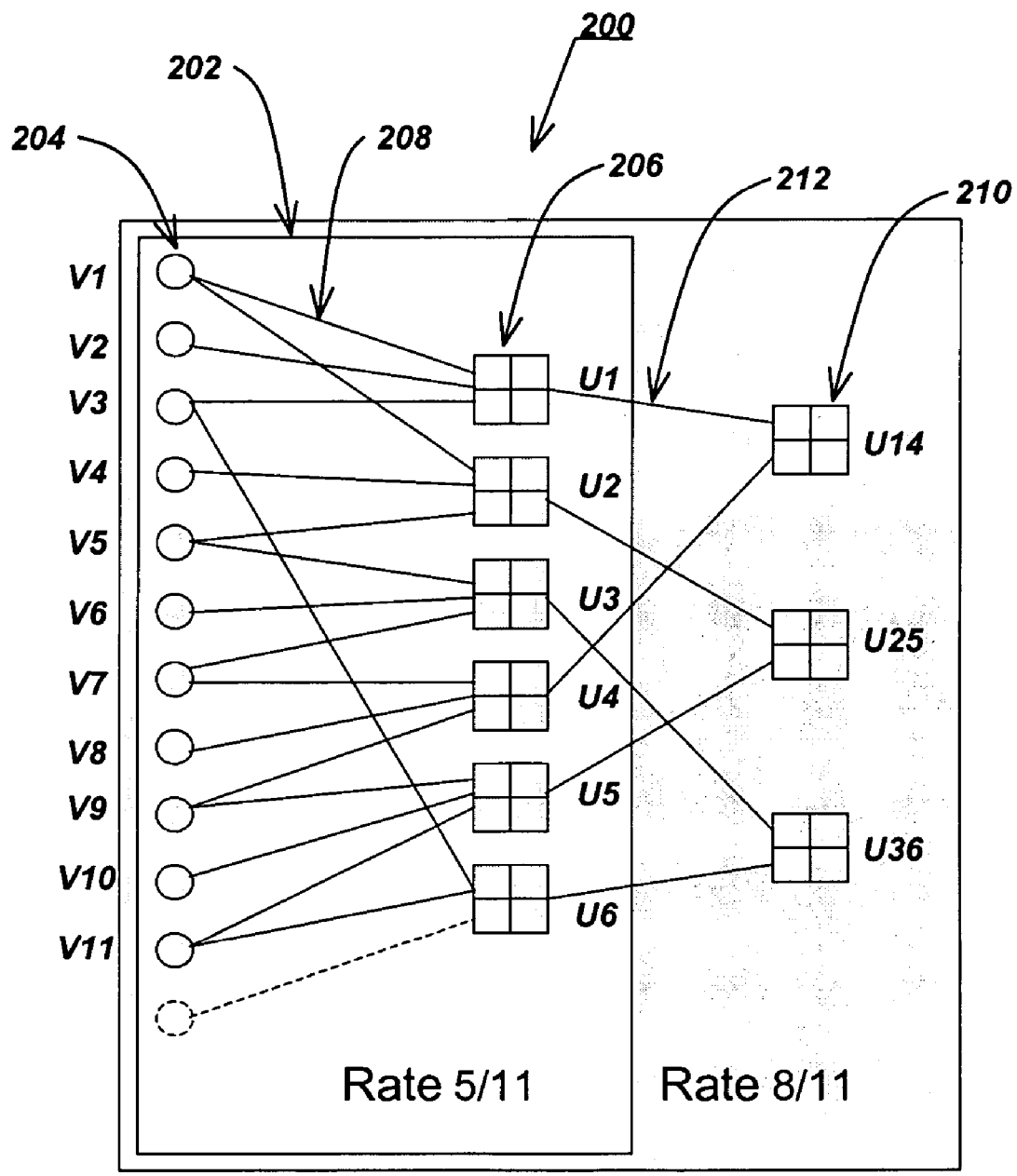

FIG. 2D illustrates how to obtain a rate-8/11 effective LDPCC from the original rate-1/2 "mother" LDPC matrix 104 that has been used throughout FIGS. 2A, 2B and 2C. The "mother" LDPC matrix 104 is shortened by fixing one variable node 204 to be zero, i.e., the variable node 204 labeled as V12 in the other figures, but which is unlabeled in this drawing and indicated by dashed lines. This effectively removes the variable node 204 from the graph 202 (and the associated column from the LDPC matrix 104). Row-combining pairs of rows from the shortened mother LDPC matrix 104 produce a rate-8/11 effective LDPCC. This rate is very close to 2/3, but now the check node 210 degree distribution is approximately (but not exactly) concentrated. Specifically, the check nodes 210 labeled as U14 and U25 have degree 6, while the check node 210 labeled as U36 has degree 5. The LDPC matrix associated with bi-partite graph 200 of FIG. 2D is the LDPC matrix shown in equation (1.2) with the last column is removed.

The degree of the check nodes 210 grows with the rate, but this degree growth is consistent with the growth of the optimal degree with rate as predicted by density evolution, as described in [7]. From a complexity perspective, note that this degree growth occurs as the number of check nodes 210 is decreasing, so that the number of edges 212 into the check nodes 210 does not change.

On the other hand, it has been found that, by making minor changes after row combining (deleting or adding a few ones to the row after row combining), the present invention can have the variable node degree distributions be different for different rates. This significantly improves performance when the decoder uses many iterations. This is known as "Row Combining with Edge Variation."

In addition, in Strict Row Combining, it has been observed that an undesirable non-concentrated check node degree distribution results when the desired rate cannot by obtained by row combining in which the present invention always combine the same number of rows. However, there is a relatively simple solution to this problem. A square mother matrix can be defined that is itself not a useful matrix as an LDPC code (since it has zero rate), but for which the number of rows has all of the factors needed, so that every desired rate can be achieved by row combining in which the present invention combines equal-size groups of rows and thereby maintain a concentrated constraint-node degree distribution. This significantly improves performance even for smaller numbers of iterations over codes with a non-concentrated constraint-node degree distribution.

Low-Complexity Encoding and Decoding

For high-speed data transmission, it is important to limit the complexity of the encoder 106 and latency of the iterative message-passing decoder 120.

Figure 3:
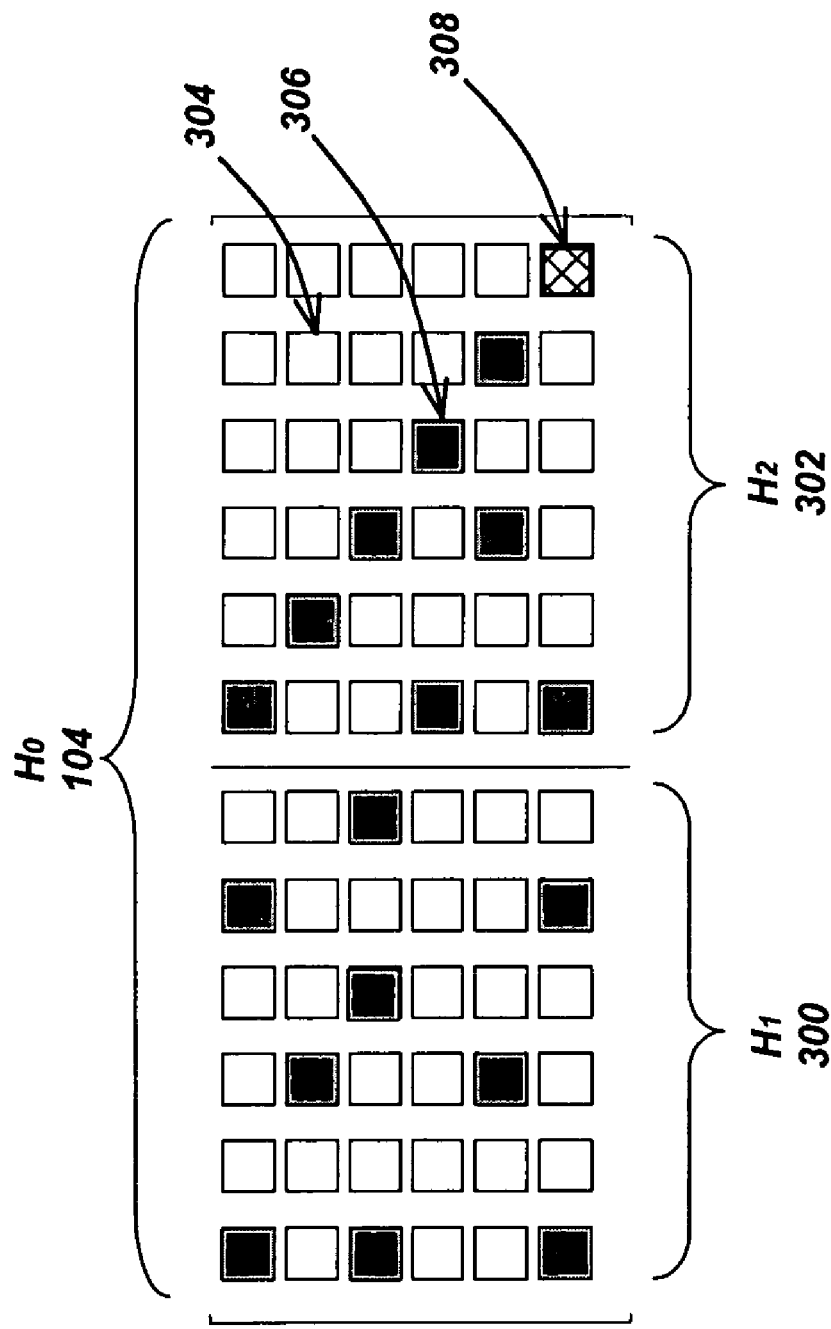
FIG. 3 illustrates the structure of a "mother" LDPC matrix that reduces encoder complexity and decoder latency.

FIG. 3 illustrates the structure of the "mother" LDPC matrix 104 for a preferred implementation that reduces encoder 106 complexity and decoder 120 latency. This description is not meant as a limitation of the invention, but as a description of a preferred embodiment that accomplishes these two goals while also providing variable rates with a constant blocklength.

For maintaining a low encoder 106 complexity, this preferred embodiment builds on the ideas presented by Yang, Ryan, and Li in [5] and Richardson and Urbanke in [7].

Following [5], FIG. 3 shows how the "mother" LDPC matrix 104, known as $H_0$, is comprised of the two sub-matrices $H_1$ 300 and $H_2$ 302, such that:

$$H_0 = [H_1 | H_2] \quad (1.5)$$

A general form for a systematic generator matrix for a $H_0$ matrix decomposed as in (1.5) is:

$$G_0 = [I \; H_1^T H_2^{-T}] \quad (1.6)$$

wherein I is an identity matrix, T indicates the matrix transpose operation and −T indicates the operation of inverting the transpose of the matrix.

In [5], the entire $H_2$ 302 is a square matrix that has a bi-diagonal structure, which is described in more detail below. In this case the systematic generator matrix $G_0$ leads to a low complexity encoder 106, wherein the input data 102 vector is multiplied by $H_1^T$ and then processed by an accumulator, as described in [5].

Each of the "effective" LDPC matrices also has an $H_2$ 302 portion, and it is difficult or impossible to maintain a bi-diagonal structure for the $H_2$ 302 portion of the "mother" LDPC matrix 104 and all of the "effective" LDPC matrices in the context of row combining. Therefore, the restriction that the $H_2$ 302 portion be bi-diagonal for the "mother" LDPC matrix 104 and all "effective" matrices is relaxed.

If there were no consideration given to facilitate parallel processing in the decoder 118, then the new restriction would be that the $H_2$ 302 portion be lower-triangular for the "mother" LDPC matrix 104 and all "effective" matrices. This would allow a low-complexity encoder 106, wherein the input data 102 vector is multiplied by $H_1^T$ and then processed by back-substitution, as described in [7]. Back-substitution is more complex than an accumulator, but it is still preferable to a full multiplication by $G_0$ (or $G_e$ in the case of an "effective" LDPC matrix).

For embodiments where there is a block structure as described below to facilitate parallel processing, then the new restriction would be that the $H_2$ 302 portion be block-lower-triangular for the "mother" LDPC matrix 104 and all "effective" matrices. Furthermore, the lower right block 308 of this matrix must be a bi-diagonal matrix, which would still allow a low complexity encoder 106, wherein the input data 102 vector is multiplied by $H_1^T$ and then processed by block-wise back-substitution. A strictly lower-triangular $H_2$ 302 (as opposed to a block-lower-triangular $H_2$ 302) is not compatible with the block structure described below. The example $H_0$ 104 in FIG. 3 has such a block-lower-triangular $H_2$ 302.

At this point, it should be emphasized that whatever structure is imposed on the LDPC matrices to ensure low-complexity encoding, that structure must be imposed on all of the "effective" LDPC matrices as well as the "mother" LDPC matrix 104. The scope of the invention is not limited to a particular structure to enable low-complexity encoding.

A reduction in the latency of the decoder 120 is often accomplished by the application of parallel processing. To facilitate parallel processing, the LDPC matrix must be constrained to have a specified structure (for example, the block structure described in [8]). Preferred embodiments of the invention specifically seek to restrict $H_0$ 104, so that $H_0$ 104 as well as all matrices $H_e$ of interest have a structure that enables parallel processing in the iterative message-passing decoder 120.

For facilitating parallel processing with a reasonably simple decoder 120, the preferred embodiment described in FIG. 3 builds on the ideas presented by Mansour and Shanbag in [8]. As in [8], the "mother" LDPC matrix ($H_0$) 104 has a block structure that is comprised of a plurality of square sub-matrices. Each square sub-matrix is either a zero sub-matrix 304 (shown as a transparent block), or a structured sub-matrix 306 (shown as a shaded block), or a bi-diagonal sub-matrix 308 (shown as the single shaded block in the lower-right corner). This overall block structure facilitates parallel processing. Specifically, the block structure enables parallel memory access. This is the key aspect that makes parallel processing useful to achieve low decoding latency.

Figure 4:
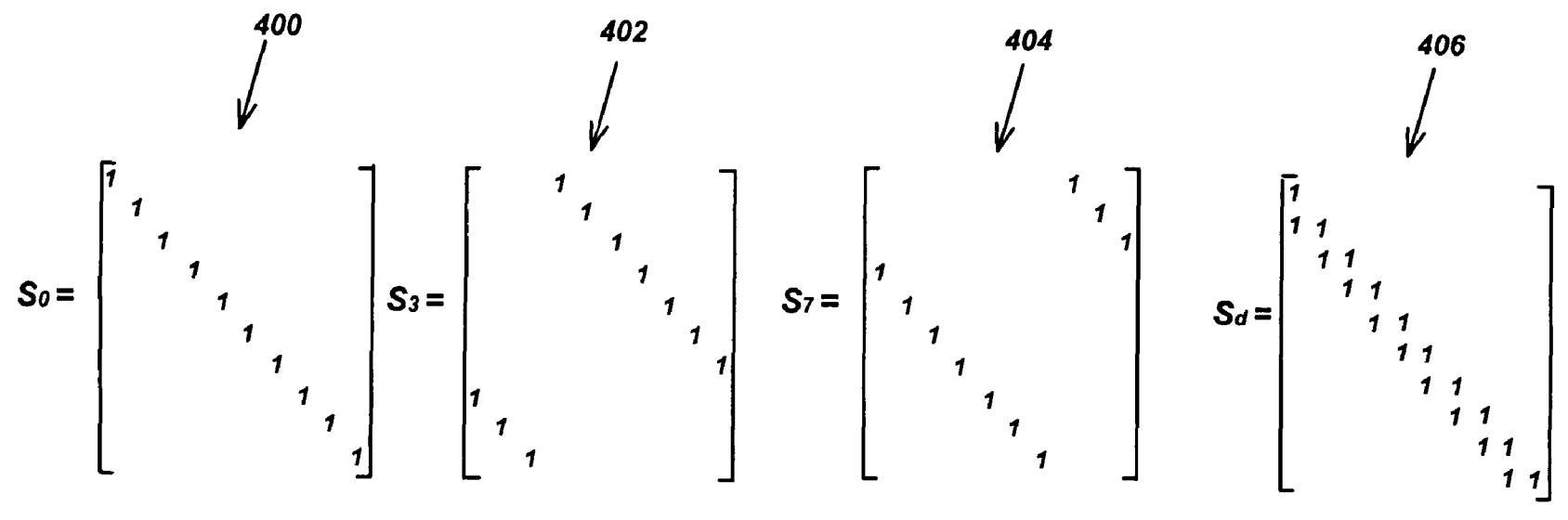

FIG. 4 provides examples (for a 10×10 sub-matrix) that illustrate the structure of the sub-matrices 306. The 10×10 sub-matrices 400, 402, and 404 labeled as $S_0$, $S_3$, $S_7$ are each a cyclic shift of the columns of the 10×10 identity matrix. Each sub-matrix $S_i$ is produced by cyclically shifting the columns of an identity matrix to the right i places. If [8] were followed exactly, each structured sub-matrix 306 would be exactly such a cyclically shifted identity matrix (although its dimension may not be 10 as in the example of FIG. 4). To follow [8] exactly in this way is a preferred embodiment. However, it is also acceptable in preferred embodiments for $H_0$ and/or $H_e$ 104 to have certain structured sub-matrices 306 that are a superposition of a plurality of cyclically-shifted identity matrices.

Note also that the bi-diagonal sub-matrix 308 used in the lower-right corner of the $H_2$ 302 portion of $H_0$ 104 in FIG. 3 is not a superposition of a plurality of cyclically-shifted identity matrices. This one sub-matrix 308 is the only exception to the restrictions described above on the structured sub-matrices in this embodiment.

At this point, it should be emphasized that whatever structure is imposed on the LDPC matrices to facilitate parallel processing in the decoder 120, that structure must be imposed on all of the "effective" LDPC matrices as well as the "mother" LDPC matrix 104. The scope of the invention is not limited to a particular structure to facilitate parallel processing.

Table 1, which is set forth below after the "Conclusion" section, completely describes a preferred rate-1/2 block-length n=1944 "mother" LDPC matrix 104 having the form illustrated in FIGS. 3 and 4. The square sub-matrices are 27×27 in this embodiment. As with FIG. 3, the sub-matrix 308 is a bi-diagonal matrix having the form illustrated by matrix 406 in FIG. 4. The last entry in Table 1 notes the placement of the bi-diagonal matrix in the lower-most, right-most position, Row 35, Column 71.

The remaining sub-matrices are either all-zeros as 304 in FIG. 3 or the superposition of one or more cyclically-shifted diagonal matrices as 306 in FIG. 3. Table 1 describes this particular "mother" LDPC matrix 104 by specifying the placement of all the cyclically-shifted diagonal matrices in the 36×72 block matrix. Rows of LDPC matrix 104 are enumerated from top to bottom, columns from left to right. For example, the first row of the table indicates that the first row (Row 0) and the fourth column (Column 3) of the block matrix will contain the diagonal matrix cyclically shifted to the right nine times. An example where a block matrix includes the superposition of more than one shifted diagonal occurs when there are more than one entry with the same Row and Column value. For example, there are two shifted diagonals superimposed at the position Row 2, Column 37.

Figure 5:
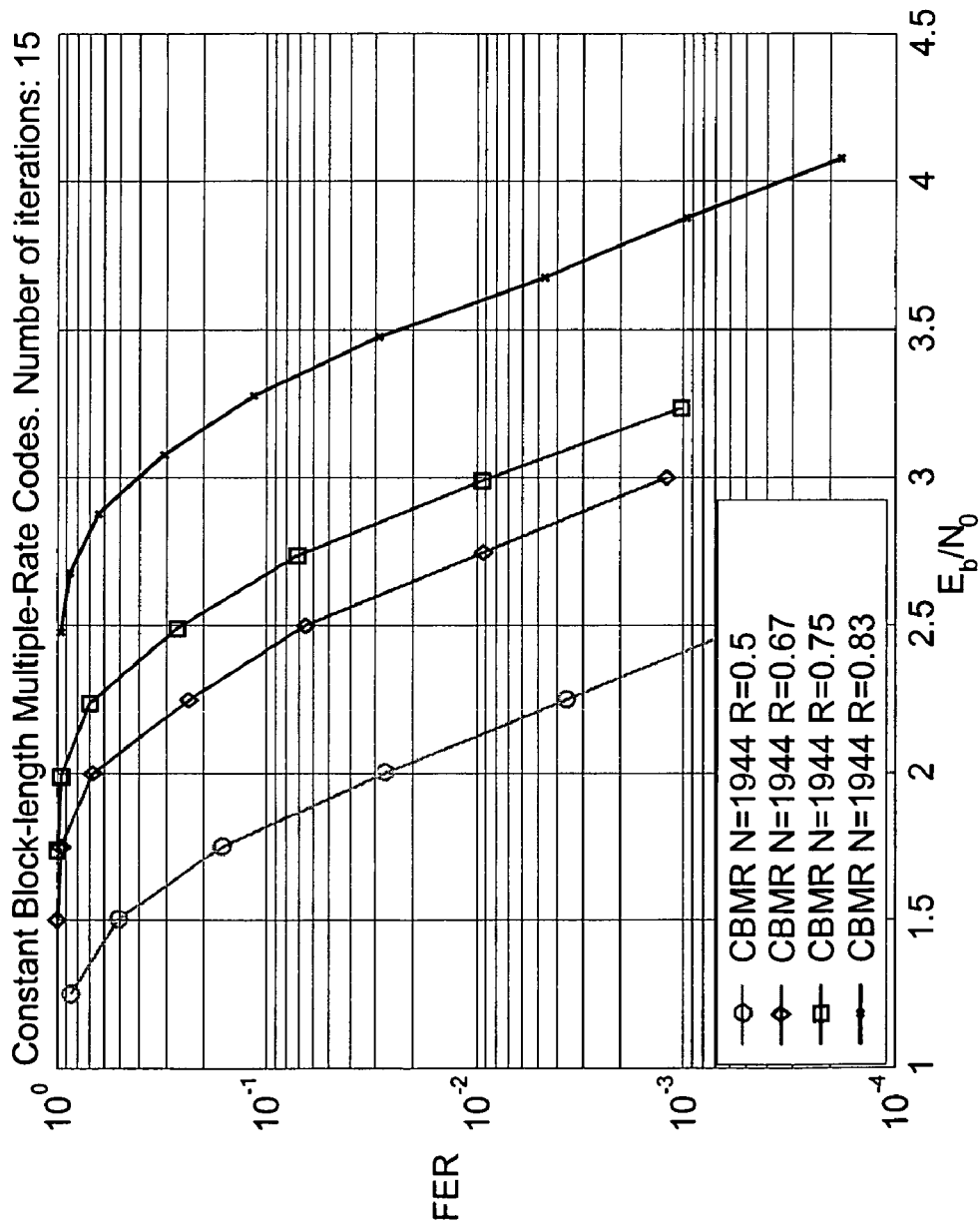
FIG. 5 is a graph of FER (frame error rate) v. $E_b/N_0$ (signal to noise ratio) for the codes in an AWGN (Additive White Gaussian Noise) channel.

The rate-1/2 "mother" LDPC matrix 104 described by Table 1 was designed to support effective LDPCCs with rates 2/3, 3/4 and 5/6 through row combining as described earlier. The performance of the codes in an AWGN (Additive White Gaussian Noise) channel can be seen on FIG. 5, which is a graph of FER (frame error rate) v. $E_b/N_0$ (signal to noise ratio).

Lowering the Error Floor

There are two basic types of LDPCCs, regular and irregular. Regular LDPCCs have the same number r of 1's in each row and the same number c of 1's in each column. In other words, both the variable node 204 and check node 206, 210 degree distributions are concentrated. Note that r need not be equal to c. Irregular codes can have a different number of 1's in different rows and a different number of 1's in different columns. At lower signal-to-noise ratio (SNR) values, irregular LDPC codes have better performance (lower bit or frame error rates) than regular LDPC codes. However, after a sufficiently high SNR value, a regular code typically has better performance than a corresponding irregular code because irregular LDPC codes display a flattening in the slope of the error curve that is often referred to as an error floor.

Graph-conditioning techniques (including, for example, [9], [10], [11], and [12]) can greatly improve the error floor of a particular irregular LDPCC, increasing the SNR value at which a corresponding regular LDPCC would have better performance. The present invention could be used in conjunction with either regular or irregular LDPCCs. Preferred embodiments of the present invention used with irregular LDPC codes build on the prior-art graph-conditioning techniques. In a preferred embodiment of the present invention, graph conditioning is applied in a new way such that the "mother" LDPC 104 matrix and all of the "effective" LDPC matrices are jointly designed to have favorable graphical properties that help to lower the error floor.

Examples of such graphical properties include (but are not limited to) a bi-partite graph that avoids small stopping sets as described in [9] and [10] and a bi-partite graph that avoids small cycles as described in [11] and [12]. The preferred embodiment described by Table 2, which is set forth below after the "Conclusion" section, describes the constraints applied to the "mother" LDPC matrix of rate 1/2 and the "effective" LDPC matrices for the effective codes with rates 2/3, 3/4 and 5/6. In addition, the length of the shortest cycle is constrained to be 6 for the "mother" LDPCC and all the "effective" LDPCCs.

As explained by Tao Tian et al. in [9], there are some structures within the graph called stopping sets that affect the performance of the codes. Small stopping sets must be avoided, so the "mother" LDPC matrix 104 described in Table 1 was generated using the ACE algorithm proposed in [9] with some modifications. The "mother" LDPC matrix 104 is constructed by generating a single column randomly until one is found where all the cycles of length equal or less than $2d_{ACE}$ that contain its corresponding variable node have an ACE metric higher or equal than $\eta_{ACE}$. The ACE metric of a cycle is the sum of the number of neighbors for each of the variable nodes in the cycle minus two times the number of variable nodes in the cycle. This process is done with all the columns starting from the one with the lowest degree.

The constraints specified by Aditya Ramamoorthy et al. in [10] also help to avoid small stopping sets in the graph especially when applied to the high degree columns. According to this criteria, a randomly generated column is valid if all the cycles of length equal or less than $2d_{SS}$ that contain its corresponding variable node have a $\beta_c$ metric of value higher or equal than $\gamma_c$ and if all the paths of length equal or less than $d_{SS}$ that contain its corresponding variable node have a $\beta_p$ metric of value higher or equal than $\gamma_p$. The $\beta$ metrics are the number singly-connected check nodes to the cycle or path respectively.

In a preferred embodiment of the present invention, the Ramamoorthy algorithm is applied in a new way such that the "mother" LDPC 104 matrix and all of the "effective" LDPC matrices are jointly designed to satisfy these criteria. The "mother" LDPC matrix 104 described in Table 1 is constructed by randomly generating a p×p submatrix according to required block structure until the ACE and β constraints are jointly satisfied for the "mother" LDPCC and all the effective LDPCCs. The β constraints were only applied to the columns of degree 7. The ACE and β constraints satisfied for the mother LDPCC and the effective LDPCCs associated with Table 1 are shown in Table 2.

Logic of an LDPCC Coder

Figure 6:
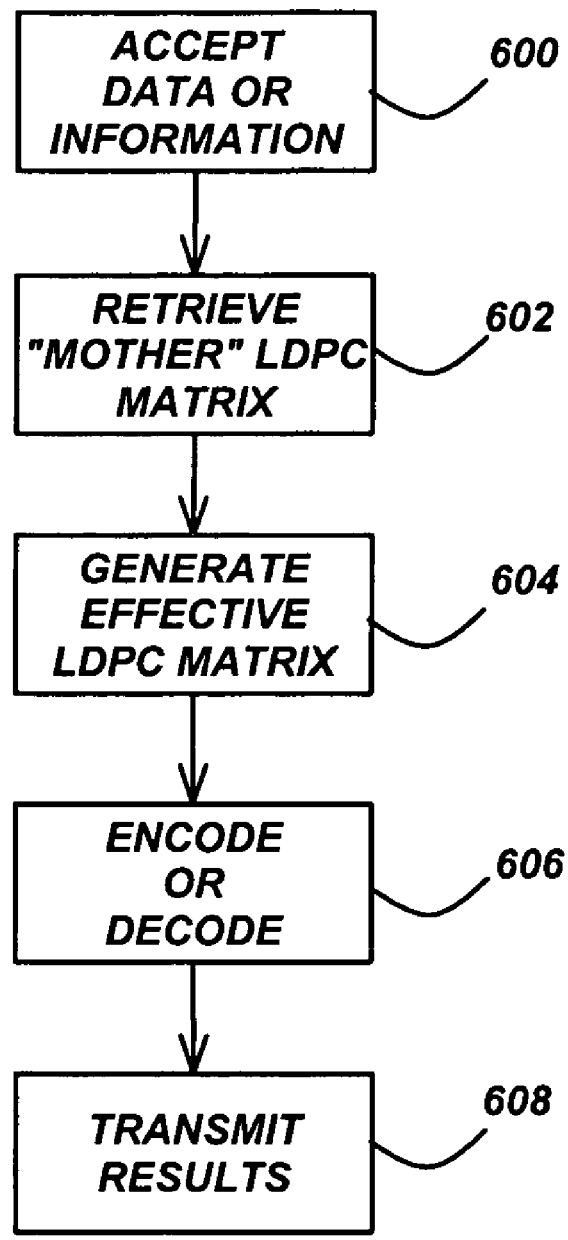
FIG. 6 is a flowchart that illustrates the logic performed by the LDPCC encoder and decoder according to the preferred embodiment of the present invention.

FIG. 6 is a flowchart that illustrates the logic performed by an LDPCC coder according to the preferred embodiment of the present invention. Specifically, an LDPCC coder (i.e., the LDPCC encoder 106, the LDPCC decoder 120, or both) codes a plurality of codes having various rates (i.e., the LDPCC encoder 106 encodes a plurality of codes having various rates, while the LDPCC decoder 120 decodes a plurality of codes having various rates), wherein the plurality of codes have an identical code blocklength and different code rates, and at least one row of a higher-rate LDPC matrix is obtained by combining a plurality of rows of a lower-rate LDPC matrix with the identical code blocklength as the higher-rate LDPC matrix. The specific logic of these functions and steps is described below.

Block 600 represents the step of the LDPCC encoder 106 or decoder 112 accepting either the input data 102 or reliability information output from the demodulator 118, respectively. The LDPCC encoder 106 is used for encoding a plurality of codes having various rates, while the LDPCC decoder 120 is used for decoding a plurality of codes having various rates.

Block 602 represents the step of the LDPCC encoder 106 or decoder 120 retrieving the "mother" LDPC matrix 104.

Block 604 represents the step of the LDPCC encoder 106 or decoder 120 generating an effective LDPC matrix according to a desired rate. As noted above, the LDPCC encoder 106 and decoder 120 support a plurality of codes have an identical code blocklength and different code rates. Consequently, if a higher rate than the "mother" LDPC matrix 104 is desired, then the higher-rate effective LDPC matrix is generated from the lower-rate "mother" LDPC matrix 104, wherein at least one row of the higher-rate LDPCC matrix is obtained by combining a plurality of rows of the lower-rate LDPC matrix with the identical code blocklength as the higher-rate LDPC matrix. On the other hand, if the lower rate of the "mother" LDPC matrix 104 is desired, then the "mother" LDPC matrix 104 is used as the LDPC matrix.

Block 606 represents the step of the LDPCC encoder 106 or decoder 120 encoding or decoding, respectively, the codeword using the input data 104 or the reliability information and the appropriate LDPC matrix.

Block 608 represents the step of the LDPCC encoder 106 or decoder 120 transmitting the results of the encoding or decoding operation in Block 606 as the output data 108 (a length n vector) or the decoded data 122 (a length $k_e$ or length $k_0$ vector), respectively.

REFERENCES

The following references are incorporated by reference herein:

[1] R. G. Gallager, "Low-Density Parity-Check Codes," IRE Trans Inform. Theory, vol. IT-8, pp. 21-28, January, 1962.

[2] J. Hagenauer, "Rate-Compatible Punctured Convolutional Codes and Their Applications," IEEE Transactions on Communications, vol. 36, pp. 389-400, April 1988.

[3] J. Ha and S. W. McLaughlin, "Analysis and design of punctured LDPCCs over Gaussian channel with erasures," Proc. Int. Symposium Inform. Theory, Lausanne, Switzerland, June 2002.

[4] T. Tian, C. Jones, and J. Villasenor. "Rate compatible low-density parity-check codes," in ISIT 2004, Chicago, July 2004.

[5] M. Yang, W. E. Ryan, and Y. Li, "Design of Efficiently Encodable Moderate-Length High-Rate Irregular LDPC Codes, IEEE Transactions on Communications, vol. 52, no. 4, pp. 564-571, April 2004.

[6] M. P. C. Fossorier, Iterative Reliability-Based Decoding of Low-Density Parity Check Codes, IEEE Journal on Selected Areas in Communications, vol. 19, no. 5, pp. 908-917, May 2001.

[7] T. J. Richardson and R. Urbanke, "Efficient encoding of low-density parity-check codes," IEEE Transactions on Information Theory, vol. 47 no. 2, February 2001

[8] M. M. Mansour and N. R. Shanbhag, "Low power VLSI decoder architectures for LDPCCs," in 2002 International Low Power Electronics and Design, 2002, pp. 284-289.

[9] Tian T., Jones C., Villasenor J. D. and Wesel R. D., "Selective Avoidance of Cycles in Irregular LDPCC Construction," IEEE Transactions on Communications, August 2004.

[10] Ramamoorthy A. and Wesel R. D., "Construction of Short Block Length Irregular LDPCCs," in Proc. IEEE ICC 2004, Paris, France, June 2004.

[11] Y. Mao and A. H. Banihashemi, "A heuristic search for good low-density parity-check codes at short block lengths," in Proc. IEEE Int. Conf. Communications, vol. 1, Helsinki, Finland, June 2001, pp. 41-44.

[12] D. M. Arnald, E. Eleftheriou, and X. Y. Hu, "Progressive edge-growth Tanner graphs," in Proc. IEEE Global Telecommunications Conf., vol. 2, San Antonio, Tex., November 2001, pp. 995-1001.

CONCLUSION

This concludes the description of preferred embodiments of the present invention. The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

TABLE 1

Table 1 has a code size 1944, and describes a prototype of a rate-½ "mother" LDPC matrix.

| Row | Column | Shift |
|---|---|---|
| 0 | 3 | 9 |
| 0 | 7 | 15 |
| 0 | 16 | 5 |
| 0 | 22 | 23 |
| 0 | 32 | 6 |
| 0 | 35 | 12 |
| 0 | 36 | 23 |
| 1 | 2 | 12 |
| 1 | 6 | 16 |
| 1 | 10 | 19 |
| 1 | 26 | 12 |
| 1 | 31 | 23 |
| 1 | 36 | 5 |
| 1 | 37 | 24 |
| 2 | 2 | 9 |
| 2 | 9 | 15 |
| 2 | 16 | 2 |
| 2 | 29 | 15 |
| 2 | 37 | 8 |
| 2 | 37 | 9 |
| 2 | 38 | 2 |
| 3 | 1 | 11 |
| 3 | 5 | 15 |
| 3 | 14 | 17 |
| 3 | 22 | 7 |
| 3 | 36 | 12 |
| 3 | 38 | 19 |
| 3 | 39 | 25 |
| 4 | 4 | 15 |
| 4 | 8 | 3 |
| 4 | 10 | 15 |
| 4 | 26 | 16 |
| 4 | 34 | 6 |
| 4 | 39 | 6 |
| 4 | 40 | 10 |
| 5 | 4 | 20 |
| 5 | 10 | 24 |
| 5 | 11 | 17 |
| 5 | 23 | 4 |
| 5 | 33 | 25 |
| 5 | 40 | 24 |
| 5 | 41 | 15 |
| 6 | 1 | 14 |
| 6 | 5 | 17 |
| 6 | 13 | 0 |
| 6 | 28 | 14 |
| 6 | 35 | 16 |
| 6 | 41 | 24 |
| 6 | 42 | 5 |
| 7 | 1 | 7 |
| 7 | 9 | 7 |
| 7 | 11 | 3 |
| 7 | 21 | 12 |
| 7 | 30 | 18 |
| 7 | 42 | 15 |
| 7 | 43 | 21 |
| 8 | 2 | 9 |
| 8 | 7 | 25 |
| 8 | 10 | 4 |
| 8 | 18 | 15 |
| 8 | 34 | 15 |
| 8 | 43 | 18 |
| 8 | 44 | 18 |
| 9 | 4 | 13 |
| 9 | 9 | 5 |
| 9 | 18 | 6 |
| 9 | 20 | 3 |
| 9 | 39 | 8 |
| 9 | 44 | 14 |
| 9 | 45 | 15 |
| 10 | 0 | 3 |
| 10 | 7 | 11 |
| 10 | 11 | 10 |
| 10 | 23 | 21 |
| 10 | 33 | 17 |
| 10 | 45 | 13 |
| 10 | 46 | 12 |
| 11 | 1 | 11 |
| 11 | 9 | 9 |
| 11 | 11 | 15 |
| 11 | 29 | 6 |
| 11 | 38 | 11 |
| 11 | 46 | 9 |
| 11 | 47 | 5 |
| 12 | 5 | 16 |
| 12 | 5 | 22 |
| 12 | 10 | 9 |
| 12 | 24 | 0 |
| 12 | 45 | 5 |
| 12 | 47 | 7 |
| 12 | 48 | 10 |
| 13 | 3 | 13 |
| 13 | 10 | 0 |

TABLE 1-continued

Table 1 has a code size 1944, and describes a prototype of a rate-½ "mother" LDPC matrix.

| Row | Column | Shift |
| --- | --- | --- |
| 13 | 13 | 20 |
| 13 | 20 | 23 |
| 13 | 42 | 7 |
| 13 | 48 | 21 |
| 13 | 49 | 14 |
| 14 | 3 | 8 |
| 14 | 7 | 1 |
| 14 | 11 | 3 |
| 14 | 25 | 24 |
| 14 | 46 | 3 |
| 14 | 49 | 3 |
| 14 | 50 | 7 |
| 15 | 0 | 8 |
| 15 | 9 | 0 |
| 15 | 11 | 5 |
| 15 | 19 | 26 |
| 15 | 31 | 8 |
| 15 | 50 | 5 |
| 15 | 51 | 2 |
| 16 | 4 | 4 |
| 16 | 8 | 6 |
| 16 | 15 | 4 |
| 16 | 19 | 11 |
| 16 | 43 | 20 |
| 16 | 51 | 5 |
| 16 | 52 | 16 |
| 17 | 1 | 10 |
| 17 | 5 | 24 |
| 17 | 10 | 13 |
| 17 | 27 | 3 |
| 17 | 32 | 26 |
| 17 | 52 | 7 |
| 17 | 53 | 24 |
| 18 | 4 | 10 |
| 18 | 8 | 8 |
| 18 | 12 | 10 |
| 18 | 30 | 21 |
| 18 | 48 | 7 |
| 18 | 53 | 16 |
| 18 | 54 | 17 |
| 19 | 4 | 23 |
| 19 | 6 | 15 |
| 19 | 14 | 14 |
| 19 | 28 | 4 |
| 19 | 50 | 5 |
| 19 | 54 | 13 |
| 19 | 55 | 11 |
| 20 | 3 | 9 |
| 20 | 6 | 18 |
| 20 | 15 | 16 |
| 20 | 25 | 5 |
| 20 | 40 | 0 |
| 20 | 55 | 12 |
| 20 | 56 | 8 |
| 21 | 0 | 4 |
| 21 | 6 | 20 |
| 21 | 11 | 6 |
| 21 | 24 | 9 |
| 21 | 55 | 20 |
| 21 | 56 | 24 |
| 21 | 57 | 12 |
| 22 | 2 | 10 |
| 22 | 8 | 12 |
| 22 | 12 | 12 |
| 22 | 27 | 4 |
| 22 | 53 | 3 |
| 22 | 57 | 0 |
| 22 | 58 | 19 |
| 23 | 0 | 2 |
| 23 | 9 | 17 |
| 23 | 17 | 17 |
| 23 | 21 | 9 |
| 23 | 49 | 14 |
| 23 | 58 | 22 |
| 23 | 59 | 23 |
| 24 | 1 | 16 |
| 24 | 7 | 5 |
| 24 | 17 | 7 |
| 24 | 29 | 12 |
| 24 | 56 | 19 |
| 24 | 59 | 23 |
| 24 | 60 | 4 |
| 25 | 0 | 8 |
| 25 | 8 | 13 |
| 25 | 18 | 1 |
| 25 | 28 | 25 |
| 25 | 44 | 1 |
| 25 | 60 | 26 |
| 25 | 61 | 13 |
| 26 | 4 | 1 |
| 26 | 9 | 1 |
| 26 | 21 | 10 |
| 26 | 26 | 12 |
| 26 | 52 | 3 |
| 26 | 61 | 6 |
| 26 | 62 | 18 |
| 27 | 3 | 21 |
| 27 | 5 | 8 |
| 27 | 22 | 13 |
| 27 | 27 | 17 |
| 27 | 59 | 21 |
| 27 | 62 | 21 |
| 27 | 63 | 12 |
| 28 | 1 | 13 |
| 28 | 8 | 26 |
| 28 | 20 | 18 |
| 28 | 32 | 11 |
| 28 | 58 | 21 |
| 28 | 63 | 23 |
| 28 | 64 | 3 |
| 29 | 2 | 16 |
| 29 | 5 | 6 |
| 29 | 19 | 10 |
| 29 | 25 | 17 |
| 29 | 54 | 20 |
| 29 | 64 | 16 |
| 29 | 65 | 8 |
| 30 | 3 | 16 |
| 30 | 7 | 15 |
| 30 | 16 | 1 |
| 30 | 31 | 0 |
| 30 | 41 | 13 |
| 30 | 65 | 15 |
| 30 | 66 | 17 |
| 31 | 0 | 20 |
| 31 | 6 | 8 |
| 31 | 15 | 4 |
| 31 | 34 | 1 |
| 31 | 51 | 22 |
| 31 | 66 | 4 |
| 31 | 67 | 8 |
| 32 | 2 | 11 |
| 32 | 7 | 17 |
| 32 | 13 | 3 |
| 32 | 33 | 12 |
| 32 | 57 | 20 |
| 32 | 67 | 7 |
| 32 | 68 | 3 |
| 33 | 0 | 19 |
| 33 | 6 | 22 |
| 33 | 14 | 8 |
| 33 | 30 | 14 |
| 33 | 35 | 18 |
| 33 | 68 | 16 |
| 33 | 69 | 0 |
| 34 | 3 | 6 |
| 34 | 6 | 0 |
| 34 | 17 | 16 |

TABLE 1-continued

Table 1 has a code size 1944, and describes a prototype of a rate-½ "mother" LDPC matrix.

| Row | Column | Shift |
|---|---|---|
| 34 | 24 | 19 |
| 34 | 47 | 12 |
| 34 | 69 | 1 |
| 34 | 70 | 21 |
| 35 | 2 | 22 |
| 35 | 8 | 22 |
| 35 | 12 | 26 |
| 35 | 23 | 1 |
| 35 | 70 | 5 |
| 35 | 71 | Sd |

TABLE 2

Table 2 includes ACE and β constrains applied to the code described on Table 1.

| | Rate | | | |
|---|---|---|---|---|
| | ½ | ⅔ | ¾ | ⅚ |
| $d_{ACE}$ | 10 | 3 | 3 | 2 |
| $\eta_{ACE}$ | 3 | 3 | 3 | 4 |
| $d_{ss}$ | 4 | 4 | 4 | 4 |
| $\gamma_c$ | 3 | 3 | 3 | 3 |
| $\gamma_p$ | 3 | 3 | 3 | 3 |

What is claimed is:

1. A data transmission apparatus, comprising:
a low density parity check (LDPC) code (LDPCC) coder for coding a plurality of codes having various rates, wherein the plurality of codes have an identical code blocklength and different code rates, and at least one row of a higher-rate LDPC matrix is obtained by combining a plurality of rows of a lower-rate LDPC matrix with the identical code blocklength as the higher-rate LDPC matrix.

2. The apparatus of claim 1, wherein the coder is an encoder for encoding the plurality of codes.

3. The apparatus of claim 1, wherein the coder is a decoder for decoding the plurality of codes.

4. The apparatus of claim 1, wherein the lower-rate LDPC matrix comprises a mother LDPC matrix.

5. The apparatus of claim 4, wherein the mother LDPC matrix has a block structure that is comprised of a plurality of square sub-matrices, wherein each square sub-matrix is either a zero sub-matrix, a structured sub-matrix, or a bi-diagonal sub-matrix.

6. The apparatus of claim 5, wherein at least one structured sub-matrix is produced by cyclically shifting the columns of an identity matrix.

7. The apparatus of claim 5, wherein at least one structured sub-matrix is a superposition of a plurality of cyclically-shifted identity matrices.

8. The apparatus of claim 5, wherein the mother LDPC matrix includes a sub-matrix with a block-lower-triangular structure.

9. The apparatus of claim 4, wherein the mother LDPC matrix includes a sub-matrix with a lower-triangular structure.

10. The apparatus of claim 1, wherein the lower-rate LDPC matrix is a square matrix.

11. The apparatus of claim 1, wherein, for at least two of the codes having the identical code blocklength and different rates, associated LDPCC matrices are jointly designed to have favorable graphical properties that help lower an error floor.

12. The apparatus of claim 1, wherein for at least two of the codes having the identical code blocklength and different rates, associated LDPCC matrices are jointly designed to have favorable graphical properties that help lower an error floor and are designed to prevent small stopping sets.

13. The apparatus of claim 1, wherein for at least two of the codes having the identical code blocklength and different rates, associated LDPCC matrices are jointly designed to have favorable graphical properties that help lower an error floor and are designed to prevent short cycles.

14. The apparatus of claim 1, wherein an LDPCC matrix for a second code is obtained from an LDPCC matrix of a first code by combining groups of rows of the LDPCC matrix of the first code and deleting at least one column of the LDPCC matrix of the first code.

15. The apparatus of claim 1, wherein groups of at least three rows of the lower-rate LDPC matrix are combined to produce a single row in the higher-rate LDPC matrix.

16. The apparatus of claim 1, wherein the lower-rate LDPC matrix is chosen so that other desired rates are obtained by combining equal-size groups of rows of the matrix.

17. The apparatus of claim 1, wherein the lower-rate LDPC matrix corresponds to a rate that is not used by the system.

18. The apparatus of claim 1, wherein, to produce the higher-rate LDPC matrix, at least one edge is deleted or added to a bi-partite graph produced by the matrix resulting from the combining of the rows.

19. A method of data transmission, comprising:
coding a plurality of codes having various rates using a low density parity check (LDPC) code (LDPCC) coder, wherein the plurality of codes have an identical code blocklength and different code rates, and at least one row of a higher-rate LDPC matrix is obtained by combining a plurality of rows of a lower-rate LDPC matrix with the identical code blocklength as the higher-rate LDPC matrix.

20. The method of claim 19, wherein the coder is an encoder for encoding the plurality of codes.

21. The method of claim 19, wherein the coder is a decoder for decoding the plurality of codes.

22. The method of claim 19, wherein the lower-rate LDPC matrix comprises a mother LDPC matrix.

23. The method of claim 22, wherein the mother LDPC matrix is a block structure that is comprised of a plurality of square sub-matrices, wherein each square sub-matrix is either a zero sub-matrix, a structured sub-matrix, or a bi-diagonal sub-matrix.

24. The method of claim 23, wherein at least one structured sub-matrix is produced by cyclically shifting the columns of an identity matrix.

25. The method of claim 23, wherein at least one structured sub-matrix is a superposition of a plurality of cyclically-shifted identity matrices.

26. The method of claim 23, wherein the mother LDPC matrix includes a sub-matrix with a block-lower-triangular structure.

27. The method of claim 22, wherein the mother LDPC matrix includes a sub-matrix with a lower-triangular structure.

28. The method of claim 19, wherein the lower-rate LDPC matrix is a square matrix.

29. The method of claim 19, wherein, for at least two of the codes having the identical code blocklength and different rates, associated LDPCC matrices are jointly designed to have favorable graphical properties that help lower an error floor.

30. The method of claim 19, wherein for at least two of the codes having the identical code blocklength and different rates, associated LDPCC matrices are jointly designed to have favorable graphical properties that help lower an error floor and are designed to prevent small stopping sets.

31. The method of claim 19, wherein for at least two of the codes having the identical code blocklength and different rates, associated LDPCC matrices are jointly designed to have favorable graphical properties that help lower an error floor and are designed to prevent short cycles.

32. The method of claim 19, wherein an LDPCC matrix for a second code is obtained from an LDPCC matrix of a first code by combining groups of rows of the LDPCC matrix of the first code and deleting at least one column of the LDPCC matrix of the first code.

33. The method of claim 19, wherein groups of at least three rows of the lower-rate LDPC matrix are combined to produce a single row in the higher-rate LDPC matrix.

34. The method of claim 19, wherein the lower-rate LDPC matrix is chosen so that other desired rates are obtained by combining equal-size groups of rows of the matrix.

35. The method of claim 19, wherein the lower-rate LDPC matrix corresponds to a rate that is not used by the system.

36. The method of claim 19, wherein, to produce the higher-rate LDPC matrix, at least one edge is deleted or added to a bi-partite graph produced by the matrix resulting from the combining of the rows.

* * * * *